(12) United States Patent
Jendrisak et al.

(10) Patent No.: US 10,536,125 B1
(45) Date of Patent: Jan. 14, 2020

(54) SYSTEM, APPARATUS, AND METHOD FOR LIMITING POWER OF RECEIVED RADIO FREQUENCY (RF) SIGNALS

(71) Applicant: Lockheed Martin Corporation, Bethesda, MD (US)

(72) Inventors: Joseph Paul Jendrisak, Endicott, NY (US); David Lardiere, Redondo Beach, CA (US)

(73) Assignee: Lockheed Marin Corporation, Bethesda, MD (US)

( * ) Notice: Subject to any disclaimer, the term of this patent is extended or adjusted under 35 U.S.C. 154(b) by 0 days.

(21) Appl. No.: 16/373,296

(22) Filed: Apr. 2, 2019

(51) Int. Cl.
  *H03K 5/08* (2006.01)
  *H03G 11/02* (2006.01)
  *H03H 11/02* (2006.01)

(52) U.S. Cl.
  CPC ............ *H03G 11/02* (2013.01); *H03H 11/02* (2013.01)

(58) Field of Classification Search
  CPC ............... H03K 5/08; H03K 17/0822; H03K 19/00315; H03G 11/002; H03G 11/02
  USPC .................................... 327/309–330; 361/56
  See application file for complete search history.

(56) References Cited

U.S. PATENT DOCUMENTS

| | | | |
|---|---|---|---|
| 4,232,278 A | 11/1980 | Gawronski et al. | |
| 5,126,701 A * | 6/1992 | Adlerstein ........... | H03G 11/025 333/17.2 |
| 5,128,636 A | 7/1992 | Furutani et al. | |
| 5,300,900 A | 4/1994 | Bellantoni | |
| 2008/0157896 A1 | 7/2008 | Bahl | |
| 2011/0255204 A1 * | 10/2011 | Satomi ................. | H03G 11/025 361/111 |
| 2017/0149238 A1 * | 5/2017 | Hutcheson ............... | G01S 7/00 |

FOREIGN PATENT DOCUMENTS

KR 101118653 B1 * 3/2012

OTHER PUBLICATIONS

Alpha Industries, Application Note 80300, "Characteristics of Semiconductor Limiter Diodes".
Skyworks Solutions, Application Note, "PIN Limiter Diodes in Receiver Protectors" Aug. 15, 2008.

* cited by examiner

*Primary Examiner* — Anh Q Tra
(74) *Attorney, Agent, or Firm* — Oblon, McClelland, Maier & Neustadt, L.L.P.

(57) ABSTRACT

A radio frequency (RF) limiter, and systems and methods thereof, to limit power of received high-power RF signals over a very broad bandwidth (e.g., approximately 17 octaves) using a single-channel solution. The limiter can be comprised of a coarse section and a fine section. The coarse section can include a first capacitor configured to receive a first RF signal; the rectifier, which is coupled to an output of the first capacitor; a transmission medium coupled to the output of the first capacitor and the rectifier; a plurality of PIN diodes each having a relatively thick I-region coupled between a second capacitor and the transmission medium; and a coupling mechanism configured to provide electrical coupling between the transmission medium and the rectifier. The rectifier can include a first inductor and a second inductor connected in series, and a Schottky diode coupled to the second inductor and the coupling mechanism.

20 Claims, 9 Drawing Sheets

SYSTEM, APPARATUS, AND METHOD FOR LIMITING POWER OF RECEIVED RADIO FREQUENCY (RF) SIGNALS

SUMMARY

Embodiments of the disclosed subject matter involve limiting power of received radio frequency (RF) signals. More particularly, embodiments of the disclosed subject matter involve systems, devices, circuitry, and methods to limit power of received relatively high-power RF signals over a relatively broad bandwidth using a single-channel solution.

According to one or more embodiments of the disclosed subject matter, a single-channel radio frequency (RF) limiter can be provided or implemented. The limiter can comprise a first capacitor configured to receive a first RF signal; a rectifier coupled to an output of the first capacitor; a first conductive track having a first length and being coupled at a first end thereof to the output of the first capacitor and the rectifier; a second capacitor configured to output a second RF signal; a plurality of first PIN diodes each having a first I-region of a first thickness coupled between the second capacitor and a second end of the first conductive track; and a coupled track configured to provide energy coupling between the first conductive track and the rectifier. The rectifier can include a first inductor and a second inductor connected in series, where a first side of the first inductor is coupled to the output of the first capacitor, and a second side of the first inductor is coupled to a first side of the second inductor. The rectifier can also include a first Schottky diode coupled to a second side of the second inductor and the coupled track.

Additionally, one or more embodiments of the disclosed subject matter can provide or implement a single-channel, high-power, ultra-broadband radio frequency (RF) limiter system. The system can comprise: a coarse limiter section configured to receive a first RF signal having a first power value; and a fine limiter section coupled to an output of the coarse limiter section and configured to output a second RF signal having a second power value, where the second power value is a limited power value less than the first power value. The coarse limiter section can include: a first in-line capacitor at an input of the coarse limiter section configured to receive the first RF signal, a second in-line capacitor at the output of the coarse limiter section, a first conductive track having a first length and being coupled between the first in-line capacitor and the second in-line capacitor, a plurality of first PIN diodes each having a first I-region of a first thickness coupled between an output of the first conductive track and the second in-line capacitor, a rectifier coupled between the first in-line capacitor and an input of the first conductive track, a self-bias limiter coupled to the rectifier, and a coupled track configured to provide energy coupling between the first conductive track and the self-bias limiter. The fine limiter section can include: a third in-line capacitor configured to output the second RF signal having the second power value, a second conductive track having a second length and being coupled between the second in-line capacitor and the third in-line capacitor, and a second PIN diode having a second I-region of a second thickness coupled between the second conductive track and the third in-line capacitor, where the first thickness of the first PIN diodes is greater than the second thickness of the second PIN diode. The rectifier can have a first inductor having a first side coupled between the first in-line capacitor and the input of the first conductive track and a second side coupled to a first node, a second inductor having a first side coupled to the first node and a second side coupled to a second node, a capacitor coupled between the first node and ground, a resistor coupled between the second node and ground, and a first Schottky diode coupled between the second node and ground. The second node can be coupled to the self-bias limiter.

Embodiments can also include methods of providing, making, and/or using apparatuses and systems, or portions thereof, according to one or more embodiments of the disclosed subject matter. Further, methods according to one or more embodiments of the disclosed subject matter may be computer-implemented methods in whole or in part, for instance, via a non-transitory computer-readable storage medium storing computer-readable instructions that, when executed by a computer, cause the computer to perform a method.

The preceding summary is to provide an understanding of some aspects of the disclosure. As will be appreciated, other embodiments of the disclosure are possible utilizing, alone or in combination, one or more of the features set forth above or described in detail below. Also, while the disclosure is presented in terms of exemplary embodiments, it should be appreciated that individual aspects of the disclosure can be separately claimed.

BRIEF DESCRIPTION OF THE DRAWINGS

The accompanying drawings, which are incorporated in and constitute a part of the specification, are illustrative of one or more embodiments of the disclosed subject matter, and, together with the description, explain various embodiments of the disclosed subject matter. Further, the accompanying drawings have not necessarily been drawn to scale, and any values or dimensions in the accompanying drawings are for illustration purposes only and may or may not represent actual or preferred values or dimensions. Where applicable, some or all select features may not be illustrated to assist in the description and understanding of underlying features.

DETAILED DESCRIPTION

Figure 1A:
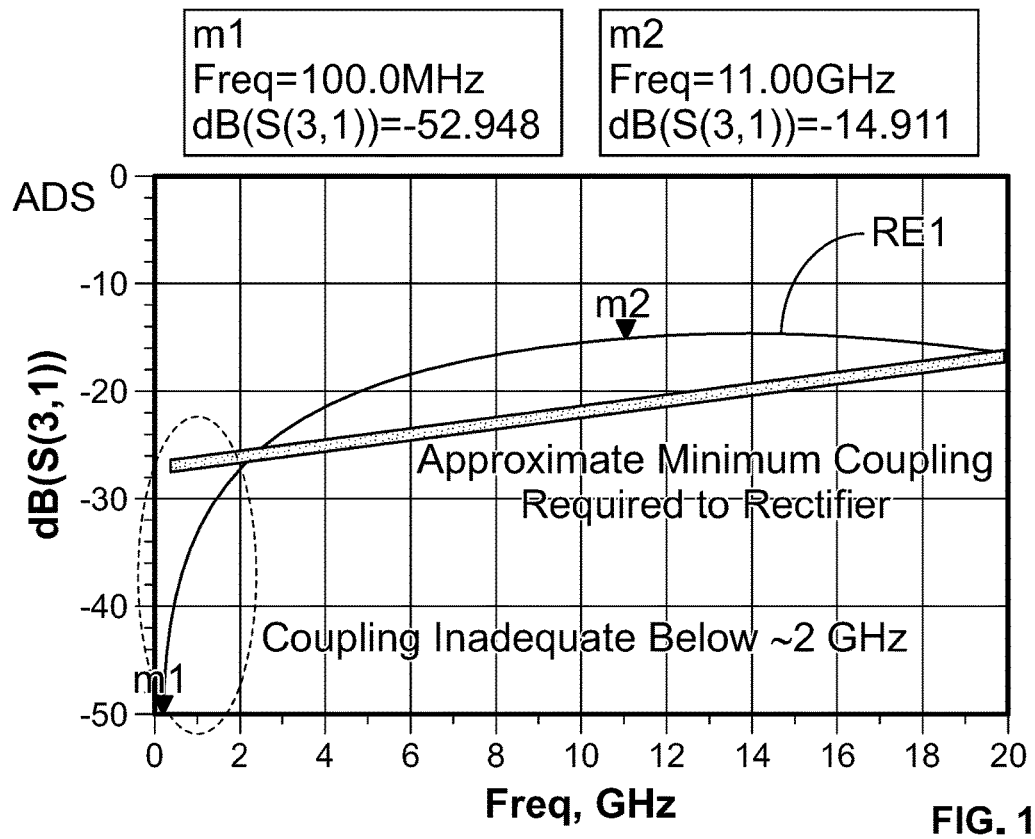
FIG. 1A is a graph showing exemplary approximate minimum coupling requirements for a limiter with an edge coupled microstrip.

The description set forth below in connection with the appended drawings is intended as a description of various embodiments of the described subject matter and is not necessarily intended to represent the only embodiment(s). In certain instances, the description includes specific details for the purpose of providing an understanding of the described subject matter. However, it will be apparent to those skilled in the art that embodiments may be practiced without these specific details. In some instances, structures and components may be shown in block diagram form in order to avoid obscuring the concepts of the described subject matter. Wherever possible, the same reference numbers will be used throughout the drawings to refer to the same or the like parts.

Any reference in the specification to "one embodiment" or "an embodiment" means that a particular feature, structure, characteristic, operation, or function described in connection with an embodiment is included in at least one embodiment. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments, and it is intended that embodiments of the described subject matter can and do cover modifications and variations of the described embodiments.

It must also be noted that, as used in the specification, appended claims and abstract, the singular forms "a," "an," and "the" include plural referents unless the context clearly dictates otherwise. That is, unless clearly specified otherwise, as used herein the words "a" and "an" and the like carry the meaning of "one or more" or "at least one." The phrases "at least one," "one or more," "or," and "and/or" are open-ended expressions that can be both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" can mean A alone, B alone, C alone, A and B together, A and C together, B and C together, or A, B and C together. It is also to be noted that the terms "comprising," "including," and "having" can be used interchangeably.

It is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the described subject matter to any particular orientation or configuration. Furthermore, terms such as "first," "second," "third," etc. merely identify one of a number of portions, components, points of reference, operations and/or functions as described herein, and likewise do not necessarily limit embodiments of the described subject matter to any particular configuration or orientation.

Control aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "circuitry," "module" or "system." Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, device, or portion thereof.

Bandwidth of a coupling mechanism, such as an edge coupled microstrip, stripline, or wirebond coupler, can be a factor affecting performance characteristics of an RF limiter that utilizes PIN diodes and a coupled rectifier current source. A minimum coupling may be needed to drive the rectifier adequately to turn on the coarse PIN diodes at a low enough RF input power, for instance, so one or more of the following conditions are met: the fine diode is not overstressed, +20 dBm flat leakage for the overall limiter (i.e., coarse and cleanup sections), and 0.5 erg max spike leakage for the overall limiter.

Figure 1B:
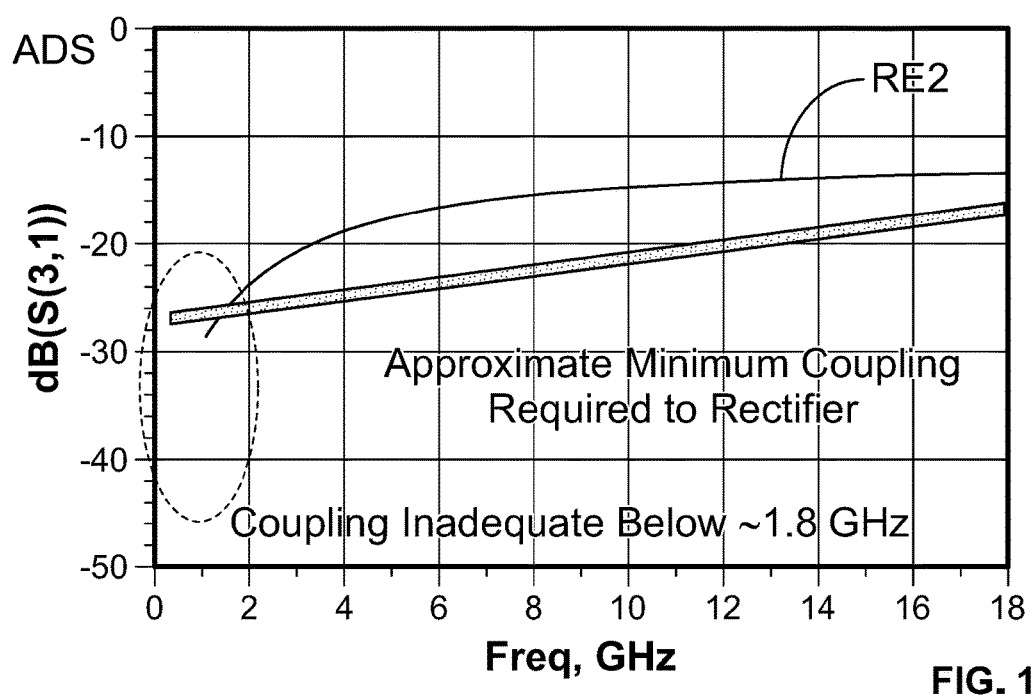
FIG. 1B is a graph showing exemplary approximate minimum coupling requirements for a limiter with a wire-bond coupler.

FIG. 1A and FIG. 1B show examples of approximate minimum coupling requirements for an RF limiter with an edge coupled microstrip and an RF limiter with a wirebond coupler, respectively. In FIG. 1A, the response RE1 for the edge coupled microstrip drops below the approximate minimum coupling requirement at approximately 2 GHz. Thus, coupling can be inadequate below 2 GHz for an RF limiter with an edge coupled microstrip. Similarly, FIG. 1B shows that the response RE2 for the wirebond coupler drops below the approximate minimum coupling requirement at approximately 1.8 GHz. Coupling, therefore, can be inadequate below 1.8 GHz for an RF limiter with a wirebond coupler.

Embodiments of the disclosed subject matter involve systems, devices, circuitry, and methods to limit power of received high-power RF signals over a relatively broad bandwidth using a single-channel solution. Limiters according to embodiments of the disclosed subject matter may be referred to as high-power ultra-broadband coupled rectifier RF limiters. Generally, embodiments of the disclosed subject matter can involve centering a response of a coupling mechanism, such as an edge coupled microstrip, stripline, or wirebond coupler, at or near the high end of the bandwidth of the limiter, in combination with a relatively low value inductor and tuning network to allow energy into the rectifier at lower frequencies where the coupling mechanism may be ineffective due to its minimum coupling requirements. The relatively low value inductance can allow leakage to the rectifier at the lower frequencies. The inductor and tuning network can thus optimize the low end rectifier response while maintaining the low end passband cutoff of the limiter.

According to one or more embodiments of the disclosed subject matter, the peak power of the received RF signals can be from 10 W to 1 kW (40 dBm to 60 dBm). Further, the single-channel limiter can accommodate a maximum bandwidth of approximately 17 octaves, VHF through Ku band, for instance, which can correspond to 0.070 to 18.25 GHz. Optionally, depending on selected values for certain limiter components, the bandwidth may be less than 17 octaves, 10 octaves, for instance, and above 3 octaves. Further, limiters according to embodiments of the disclosed subject matter can accommodate a relatively wide bandwidth (e.g., 0.070 to 18.25 GHz) without band-switching between different limiters associated with different bandwidths (and without a corresponding external power source for the switching). That is, according to one or more embodiments of the disclosed subject matter, a switched filter/limiter arrangement that combines separate band limiters, such as lowband, middle-band, and high-band, with RF switching to select the desired band limiter is not implemented. Further, limiters according to embodiments of the disclosed subject matter can have less insertion loss as compared to such a switched filter/limiter arrangement that performs filtering and switching of the received RF signal.

Limiters according to embodiments of the disclosed subject matter can have one or more (including all) of the following performance characteristics: a bandwidth from 0.070 to 18.25 GHz, as noted above; a small signal insertion loss less than or equal to 3 dB (i.e., ½ power); Voltage Standing Wave Ratio (VSWR) of 2.0:1; spike leakage less than or equal to 0.5 ergs; flat leakage less than or equal to 20 dBm; and recovery time less than or equal to 7 microseconds. Additionally or alternatively, limiters according to embodiments of the disclosed subject matter can have input power/pulsewidths according to the non-limiting examples shown in the table below.

| Frequency Range (GHz) | Peak Power (dBm) | Peak Power (Watts) | Pulse Width (microseconds) | Average Power (dBm) | Average Power (Watts) |
|---|---|---|---|---|---|
| 0.070 to 1 | 40 | 10 | 130 | 30 | 1 |
| 1 to 18.25 | 50 | 100 | 33 | 30 | 1 |
| 2.5 to 3.5 | 60 | 1000 | 33 | 40 | 10 |

Figure 2:
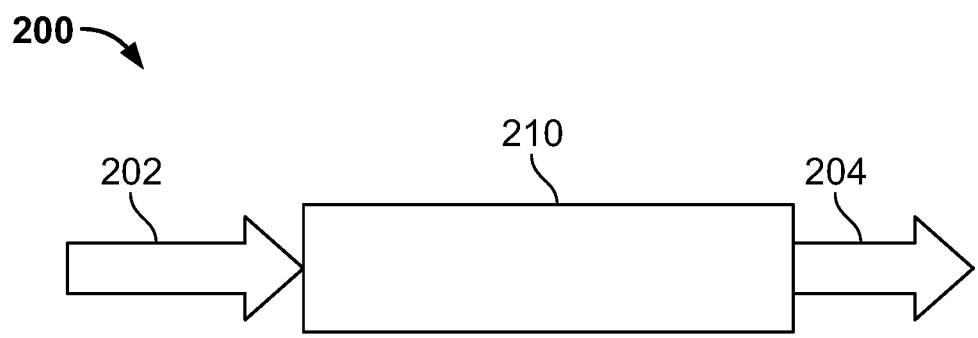
FIG. 2 is a block diagram of a limiter system according to one or more embodiments of the disclosed subject matter.

FIG. 2 is a block diagram of a limiter system 200 according to one or more embodiments of the disclosed subject matter. The limiter system 200 may be part of a larger system, such as an RF receiver (not expressly shown). Thus, in one or more embodiments of the disclosed subject matter, the limiter system 200 can be a front end component of an RF receiver, provided behind an antenna, for instance, to protect the front end low noise amplifier inputs from high-power RF signals.

System 200 can include a limiter 210 according to embodiments of the disclosed subject matter. Limiter 210 can be configured to receive an RF signal 202 and output a limited RF signal 204 by way of a single channel. Optionally, system 200 can have more than one limiter 210 having the same or substantially the same configuration. Thus, while each limiter 210 may be a single-channel limiter, system 200 can have a plurality of single-channel limiters 210 each configured to limit the RF signal 202.

The RF signal 202 can have a peak power from 10 W to 1 kW (40 dBm to 60 dBm) and a frequency from 0.070 to 18.25 GHz, for instance. Optionally, in one or more embodiments, the peak power of the RF signal 202 can be greater than 1 kW. The limited RF signal 204 can be limited by the limiter 210 in terms of power level. For example, relative to the RF signal 202, the limited RF signal 204 can be limited in terms of a small signal insertion loss less than or equal to 3 dB (i.e., ½ power), spike leakage less than or equal to 0.5 ergs, and/or flat leakage less than or equal to 20 dBm.

Figure 3:
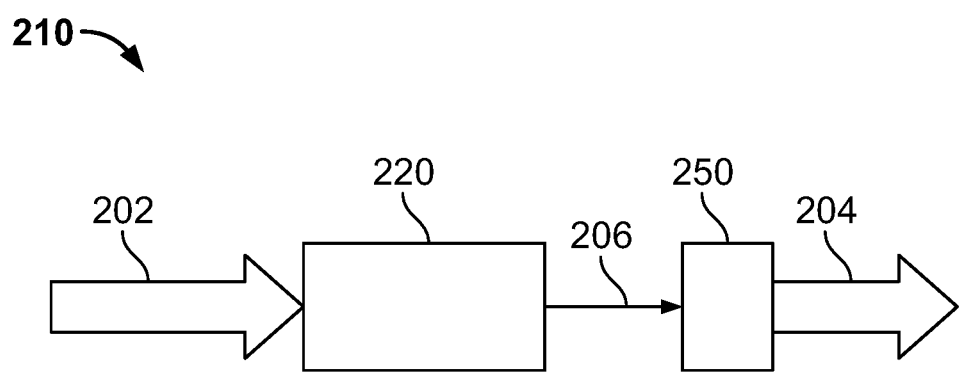
FIG. 3 is a block diagram of components of the system of FIG. 2.

FIG. 3 is a block diagram of the limiter 210 of FIG. 2 showing that the limiter 210 generally can be comprised of two sections, a coarse section 220 and a fine or cleanup section 250. Of course, embodiments of the disclosed subject matter may pertain to either the coarse section 220 or the fine section 250 individually. Generally, according to one or more embodiments, the coarse limiter section 220 and the fine limiter section 250 of the limiter 210, together, have a bandwidth from 0.070 to 18.25 GHz. Additionally or alternatively, the coarse limiter section 220 and the fine limiter section 250 of the limiter 210 can be configured to be operational such that a small signal insertion loss is less than 3 dB, a VSWR is 2:1, a spike leakage is less than or equal to 0.5 ergs, a flat leakage is less than or equal to 20 dBm, and/or a recovery time is less than or equal to seven microseconds.

The fine section 250 can receive an RF signal 206 outputted from the coarse section 220, which is based on the RF signal 202 and, with the coarse section 220 "off" (i.e., the coarse PIN diodes not providing a low RF resistance to ground), the fine section 250 can "turn on" (i.e., the fine PIN diode provides a low RF resistance to ground) to limit power levels for the RF signal 206 up to a predetermined power level threshold. The predetermined power level threshold can be dependent upon the frequency of the RF signal 206. However, according to embodiments of the disclosed subject matter, the coarse section 220 can "turn on" across the entire bandwidth, particularly even at the low end of the bandwidth. Put another way, according to one or more embodiments of the disclosed subject matter, the fine section 250 may not handle all of the RF signal 206 when the RF signal 206 has a frequency at the low end of the bandwidth, for instance, below 2 GHz. Thus, the fine section 250 can provide protection for downstream components prior to the coarse section 220 "turning on." For example, the fine section 250 can limit leading edge spike energy at the output of the coarse section 220 and overall flat leakage, for instance, to less than or equal to 20 dBm.

When the power level of the RF signal 202 reaches the predetermined power level threshold, the coarse section 220 can "turn on" to protect the fine section 250, particularly the fine PIN diode of the fine section 250. According to one or more embodiments of the disclosed subject matter, the coarse PIN diodes can "turn on" no later than when the power level of the RF signal 202 is 36 dBm. Further, according to one or more embodiments of the disclosed subject matter, the coarse PIN diodes can "turn on" such that flat leakage remains less than or equal to 20 dBm, for instance.

Limiting power levels by the coarse section 220 and the fine section 250 can involve the various PIN diodes, depending upon which of the coarse section 220 and/or the fine section 250 is "turned on," providing a low RF resistance (e.g., 2 Ohms) to ground that creates a near short circuit reflection of a portion of the input RF energy back toward the input of the coarse section 220. The low RF resistance to ground can be caused by the RF voltage across the PIN diode terminals creating a forward bias DC current from a coupled rectifier (discussed in more detail below) that floods the I-region of the PIN diode. The limiter 210 may be comprised of PIN diodes with a relatively thick I-region for the coarse section 220 and a PIN diode with a relatively thin I-region for the fine section 250. Thus, in one or more embodiments, the limiter 210 may not include a so-called "medium" PIN diode with an I-region having a thickness between the thicknesses of the PIN diodes of the coarse section 220 and the fine section 250.

Figure 4:
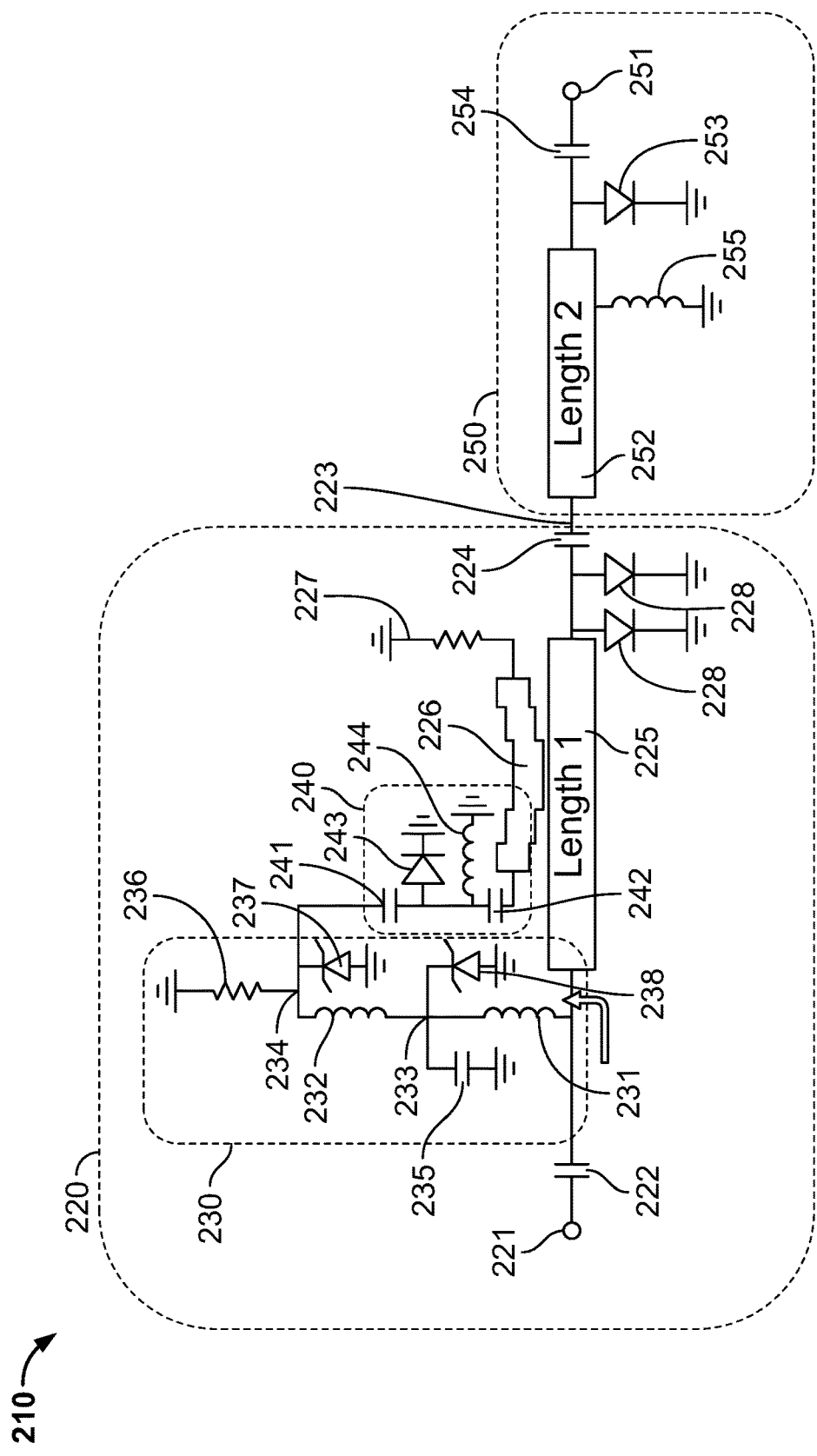
FIG. 4 is schematic representation of exemplary limiter circuitry according to one or more embodiments of the disclosed subject matter.

FIG. 4 is schematic representation of exemplary circuitry of the limiter 210 according to one or more embodiments of the disclosed subject matter. Notably, FIG. 4 shows non-limiting examples of circuit components and configurations for coarse section 220 and fine section 250.

The coarse section 220 can have an input 221 configured to receive an RF signal, such as RF signal 202 discussed above. A first capacitor 222 may be provided at the input 221. As shown in FIG. 4, the first capacitor 222 can be arranged according to an "in-line" configuration. Thus, the first capacitor 222 can receive the RF signal 202 as an input to the limiter 210. The coarse section 220 can also have a second capacitor 224 at an output 223 thereof. As shown in FIG. 4, the second capacitor 224 can be arranged according to an "in-line" configuration. As a non-limiting example, each of the first capacitor 222 and the second capacitor 224 can have a total capacitance of 136 pF.

Between the input 221 and the output 223, the coarse section 220 can include a conductor 225, which may be referred to herein as a first conductive track, a plurality of first PIN diodes 228, and a rectifier 230. Discussed in more detail below, a coupled conductor 226 can be provided adjacent to the conductor 225. Optionally, the coarse section 220 can include a self-biasing limiter 240 provided between the rectifier 230 and the coupled conductor 226.

Each of the first PIN diodes 228 can be coupled between ground and an interface between the output of the conductor 225 and the second capacitor 224. As shown in FIG. 4, the first PIN diodes 228 can be connected in parallel with each other between ground and the interface between the output of the conductor 225 and the second capacitor 224. Further, each first PIN diode 228 can have a relatively thick I-region. For example, the I-region for each first PIN diode 228 can be 28 microns. According to one or more embodiments of the disclosed subject matter, only two of the first PIN diodes 228 can be provided. Generally, such first PIN diodes 228 with relative thick I-regions can handle relatively high power, have suitably low loss, and suitable VSWR.

The conductor 225 can be provided between the input 221 and the output 220 of the coarse section 220. As shown in FIG. 4, an input side of the conductor 225 may be coupled to (indirectly or directly) the first capacitor 222 and the rectifier 230, and an output side of the conductor 225 may be coupled to (indirectly or directly) the second capacitor 224 and the first PIN diodes 228.

Additionally, the conductor 225 may be coupled to the coupled conductor 226 such that a portion of an input signal (i.e., RF signal 202) to the limiter 210 is provided from the conductor 225 to the coupled conductor 226. Put another way, the coupling can be such that energy from the input signal is sent from the conductor 225 to the coupled conductor 226 for supply to a drive circuit (e.g., rectifier) for the drive circuit to provide DC current to the first PIN diodes 228. Further, such coupling may be characterized as a backward wave coupling of energy from the conductor 225 to the coupled conductor 226. As non-limiting examples, conductor 225 and coupled conductor 226 may be coupled via edge-coupling of common edges, a stripline, or a wirebond coupler.

According to one or more embodiments, the conductor 225 may be a conductive track in the form of a microstrip line, for instance, a microstrip substrate having a thickness of 10 mil. The conductor 225 in the form of a conductive track, for instance, has a length that can be set for suitable rectifier response across operational bandwidth (e.g., 0.070 to 18.25 GHz) for all conditions of resistances to ground for the PIN diodes of the limiter 210. For example, the length of the conductor 225 may be lambda/4 at a frequency approximately 77% of the bandwidth up from the lowest frequency of the limiter 210.

In addition to being coupled to the conductor 225 as discussed above, the coupled conductor 226 can be coupled between ground and the rectifier 230. Optionally, as shown in FIG. 4, a resistor 227 may be coupled between one end of the coupled conductor 226 and ground. Further, optionally, a self-biasing limiter 240 can be coupled to another end of the coupled conductor 226, between the coupled conductor 226 and the rectifier 230. As non-limiting example, resistor 227 can have a value of 50 Ohms.

As noted above, as non-limiting examples, coupled conductor 226 and conductor 225 may be coupled via edge-coupling of common edges, a stripline, or a wirebond coupler. Further, the coupled conductor 226 may be a conductive track in the form of a microstrip line, for instance, a microstrip substrate having a thickness of 10 mil.

Rectifier 230 can be coupled between the input 221, particularly first capacitor 222, and the conductor 225. Rectifier 230 may also be coupled to coupled conductor 226 directly or via an optional self-biasing limiter 240, such as shown in FIG. 4. Generally, the rectifier 230, according to embodiments of the disclosed subject matter, can allow energy leakage for the input signal (i.e., RF signal 202) from between the capacitor first 222 and the conductor 225 to the rectifier 230. Such leakage into the rectifier 230 can be at relatively low frequencies, such as from 0.070 to 2 GHz. Further, such leakage into the rectifier 230 can occur at the same time as when the rectifier 230 receives coupled energy from the coupling of the coupled conductor 226 and the conductor 225, for instance, at a crossover frequency region (e.g., from 1 to 2 GHz). Thus, the rectifier 230 can be configured to optimize the low end rectifier response while meeting small signal insertion loss requirements (e.g., less than 3 dB) and maintaining the low end passband cutoff of the limiter 210.

The rectifier 230 can have two inductors, a first inductor 231 and a second inductor 232. The first indictor 231 and the second inductor 232 may be connected in series, a first node 233 provided there between. In contrast to a rectifier with a single inductor having a relatively large inductance value, rectifiers according to embodiments of the disclosed subject matter, such as rectifier 230, can have inductance values for the first inductor 231 and the second inductor 232 that allow energy leakage for the input signal (i.e., RF signal 202) from between the capacitor first 222 and the conductor 225 to the rectifier 230, including at relatively low frequencies, such as from 0.070 to 2 GHz. To be clear, the first inductor 231 and the second inductor 232 can also allow energy leakage to the rectifier 230 at frequencies higher than 2 GHz, such as up to 18.25 GHz. Thus, inductance values of the first inductor 231 and the second inductor 232 can optimize the low end rectifier response while meeting small signal insertion loss requirements (e.g., less than 3 dB) and maintaining the low end passband cutoff of the limiter 210. As non-limiting examples, first inductor 231 and second inductor 232 can have an inductance value of 70 nanoHenries and an inductance value of 7.5 nanoHenries, respectively.

As shown in FIG. 4, a first side of first inductor 231 can be coupled between the first capacitor 222 and the input of the conductor 225 and a second side of first inductor 231 can be coupled to the first node 233. FIG. 4 also shows a first side of second inductor 232 being coupled to the first node 233 and a second side of the second inductor being coupled to a second node 234. A capacitor 235 may be connected between the first node 233 and ground. Further, a resistor 236 may be coupled between the second node 234 and ground. As non-limiting example, resistor 236 can have a value of 120 Ohms.

The rectifier 230 can also include a first Schottky diode 237 coupled between the second node 234 and ground. The first Schottky diode 237 can also be coupled to the second side of the second inductor 234 and the coupled conductor 226 either directly or via the self-biasing limiter 240, if provided, such as shown in FIG. 4.

Generally, the first Schottky diode 237, which may be a zero-bias detector diode, can drive the first PIN diodes 228. That is, the first Schottky diode 237 can provide rectified DC current to the first PIN diodes 228 via the second inductor 232, the first inductor 231, and the conductor 225. Rectified DC current output from the first Schottky diode 237 may be in response to "turning on," i.e., biasing from energy coupled to the coupled track 226 and/or leakage via the first inductor 231 and through the second inductor 232. Optionally, the first Schottky diode 237 may have characteristics particularly suitable for optimal Ku band (i.e., 12-18 GHz) performance.

Optionally, the rectifier 230 can include a second Schottky diode 238 connected between the first node 233 and ground. The addition of the second Schottky diode 238, which may be a zero-bias detector diode, can provide for greater sensitivity in the lowband region, such as in the crossover region (e.g., 1 to 2 GHz). In one or more embodiments, the second Schottky diode 238 may be operational (i.e., "turned on") for frequencies from 0.070 to 2 GHz. Further, second Schottky diode 238 may have a breakdown voltage that is greater than a breakdown voltage of the first Schottky diode 237.

The coarse section 220 can optionally include self-biasing limiter 240 coupled between the rectifier 230 and the coupled conductor 226. The self-biasing limiter 240 can include a capacitor 241 coupled to the coupled conductor 226, a capacitor 242 coupled to the second node 234, and a diode 243 and an inductor 244 each coupled between the capacitors 241, 242 and ground. As non-limiting examples, the diode 243 may be a PIN diode having an I-region with a thickness of 2 microns, and the inductor 244 may have an inductance of 57 nanoHenries.

In operation, high RF voltage across the terminals of diode 243 creates a DC current that floods the I-region of the diode 243 with carriers and lowering the RF resistance of the diode 243. Low RF resistance creates a near short circuit reflection of the input signal and limits the transmitted power output. Thus, generally, the self-biasing limiter 240 can protect the rectifier 230, particularly the first Schottky diode 237, from reverse voltage breakdown or burnout at relatively high input power.

The self-biasing limiter 240 can also increase the dynamic range of the first Schottky diode 237. That is, the self-biasing limiter 240 can allow energy to be coupled to the rectifier 230 so as to flatten the response across frequencies to increase the dynamic range. For example, the first Schottky diode 237 can handle a maximum input power of +30 dBm (pulsed or continuous wave (CW)). In the 1 kW (+60 dBm) input region (e.g., 2.5 to 3.5 GHz), for instance, the coupling value of the conductor 225 and the coupled conductor 226 can be ~26 dB, which corresponds to a maximum limiter input power of +56 dBm (i.e., 56−26=30 dBm at the first Schottky diode 237). As a non-limiting example, the self-biasing limiter 240, particularly the diode 243 and the inductor 244), can have a maximum input power of +53 dBm and a flat leakage of +27 dBm at this input power, and can provide 3 dB of margin for the first Schottky diode 237. At a one microsecond pulse width, for instance, a maximum input power to the limiter 210 can now be +53+26=+79 dBm at maximum power to the inductor 244 of the self-biasing limiter 240, an increase in dynamic range of +23 dB for the rectifier 230. At thirty-three microsecond pulse width, for instance, the maximum input power to the inductor 244 is +37 dBm, an increase in dynamic range of +7 dB for the rectifier 230.

The fine section 250 can have an input coupled to the output 223 of the coarse section 220. FIG. 4, for instance, shows the second capacitor 224 being coupled to the input of the fine section 250. An output 251 of the fine section 250, which may also be considered the output of the limiter 210, can output a limited RF signal, such as limited RF signal 204. The limited RF signal can have a power level less than a power level of an RF signal input to the limiter 210, such as the input RF signal 202. The fine section 250 can also limit the leading edge spike energy out of the coarse section 220 and limit overall flat leakage, for instance, to +20 dBm.

The fine section 250 can include a conductor 252, a second PIN diode 253, and a third capacitor 254. As shown in FIG. 4, the third capacitor 254 may be couple "in line" between the input and the output of the fine section 250. Optionally, the fine section 250 may have an inductor 255 coupled to the second conductor 252, for instance, and ground. As non-limiting examples, the inductor 255 may have an inductance of 220 nanoHenries, and the third capacitor 254 may have a capacitance of 136 pF.

The conductor 252, which may be referred to herein as a second conductor or a second conductive track, can be provided between the input and the output 251 of the fine section 250. According to one or more embodiments, the conductor 252 may be a conductive track in the form of a microstrip line, for instance, a microstrip substrate having a thickness of 10 mil. The conductor 252 in the form of a conductive track, for instance, has a length that can be set for suitable rectifier response across operational bandwidth (e.g., 0.070 to 18.25 GHz) for all conditions of resistances to ground for the PIN diodes of the limiter 210. For example, the length of the conductor 252 may be 90% of lambda/2 at the highest frequency of operation of the limiter 210. In one or more embodiments, the length of the conductor 252 and the length of conductor 225 (of the coarse section 220) may be selected together to provide suitable rectifier response across operational bandwidth (e.g., 0.070 to 18.25 GHz) for all conditions of resistances to ground for the PIN diodes of the limiter 210.

The second PIN diode 253 can be coupled between ground and an interface between the conductor 252 and the output 251 of the fine section 250. FIG. 4 shows second PIN diode 253 being coupled between ground and an interface between the conductor 252 and the third capacitor 254. The second PIN diode 253 can have a relatively thin I-region, particularly thinner than the I-regions of the first PIN diodes 228. For example, the I-region for the second PIN diode 253 can be 2 microns. According to one or more embodiments of the disclosed subject matter, only one second PIN diode 253 can be provided. Thus, embodiments of the disclosed subject matter can handle relatively high power at a lower end of the frequency spectrum (e.g., near VHF) without implementing multiple second PIN diodes. Moreover, implementing only one second PIN diode 253 can result in less loss (since less second PIN diodes) and improved VSWR.

Figure 5A:
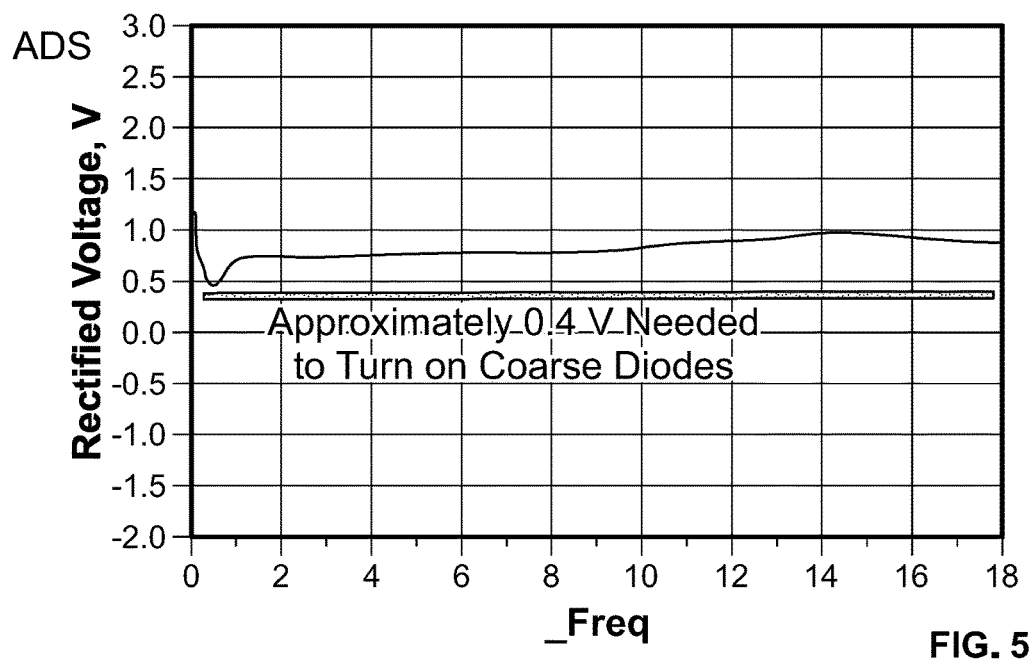
FIG. 5A is a graph showing an example of rectified DC voltage across coarse diodes of the limiter circuitry of FIG. 4.
Figure 5B:
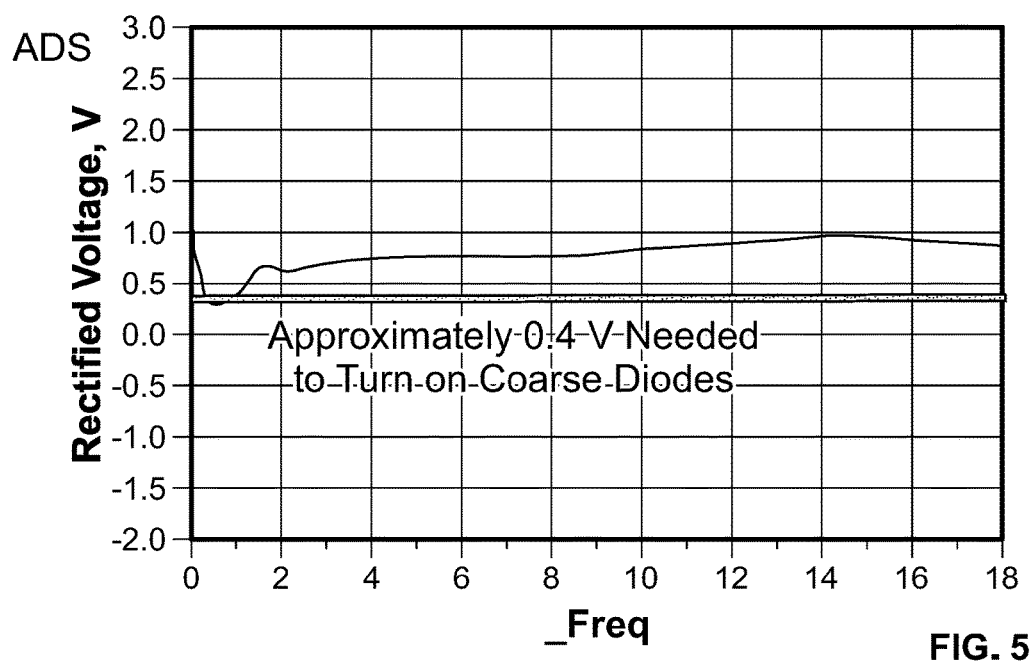
FIG. 5B is a graph showing an example of rectified DC voltage across coarse diodes of limiter circuitry according to a variation of the limiter circuitry shown in FIG. 4.

FIG. 5A is a graph showing an example of rectified DC voltage across the first PIN diodes 228 of the limiter 210 of FIG. 4. FIG. 5B is a graph showing an example of rectified DC voltage across the first PIN diodes 228 of the limiter 210 according to a variation of the limiter 210 shown in FIG. 4, particularly where the second Schottky diode 238 is not implemented. Notably, FIG. 5A and FIG. 5B show examples of rectified DC voltages across the first PIN diodes 228 of the limiter 210 where the RF input power across frequency is less than or equal to +36 dBm and the second PIN diode 253 is "on" or in a limiting state (i.e., low RF resistance). Approximately 0.4 V (400 mV) at less than or equal to +36 dBm can "turn on" the first PIN diodes 228 to protect the second PIN diode 253. That is, based on the rectified DC voltage the first PIN diodes 228 can "turn on" before the power value of the RF input signal reaches +36 dBm.

Figure 6A:
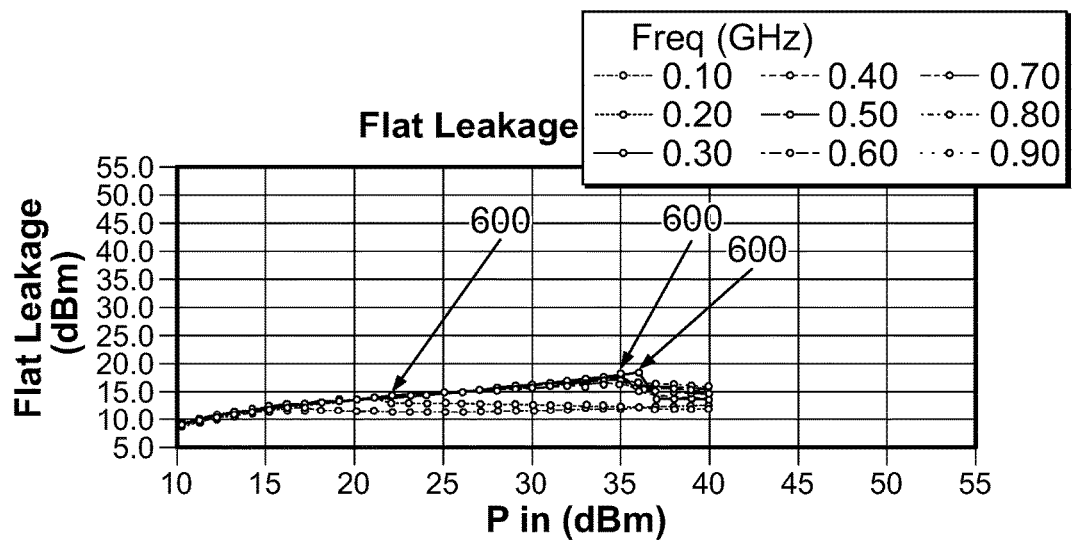
FIGS. 6A-6G show graphs of power in to a limiter (dBm) v. flat leakage out of limiter (dBm) for input RF frequencies from 0.1 GHz to 18 GHz for limiters according to one or more embodiments of the disclosed subject matter.
Figure 6B:
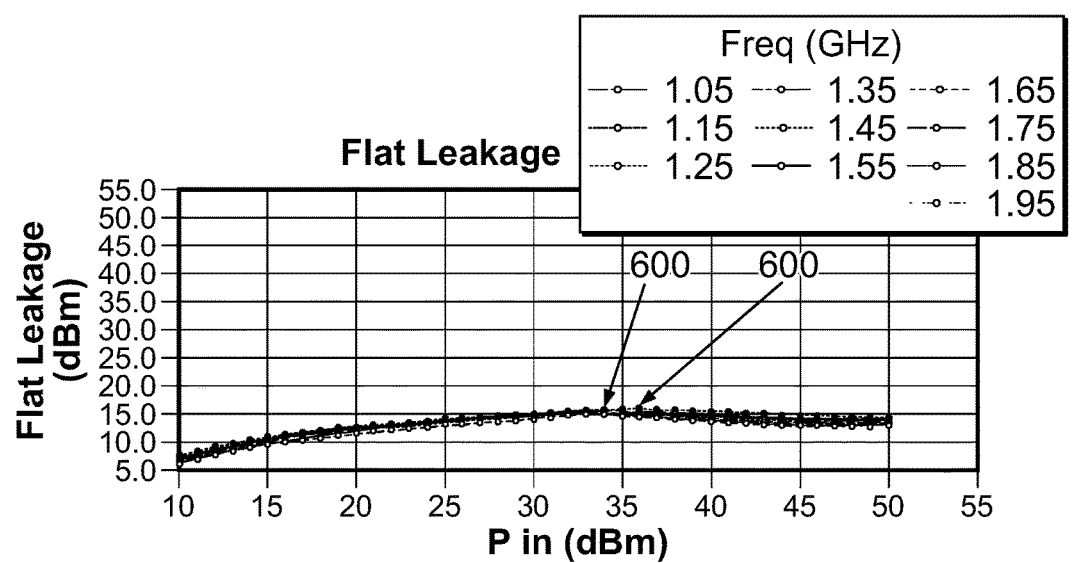
Figure 6C:
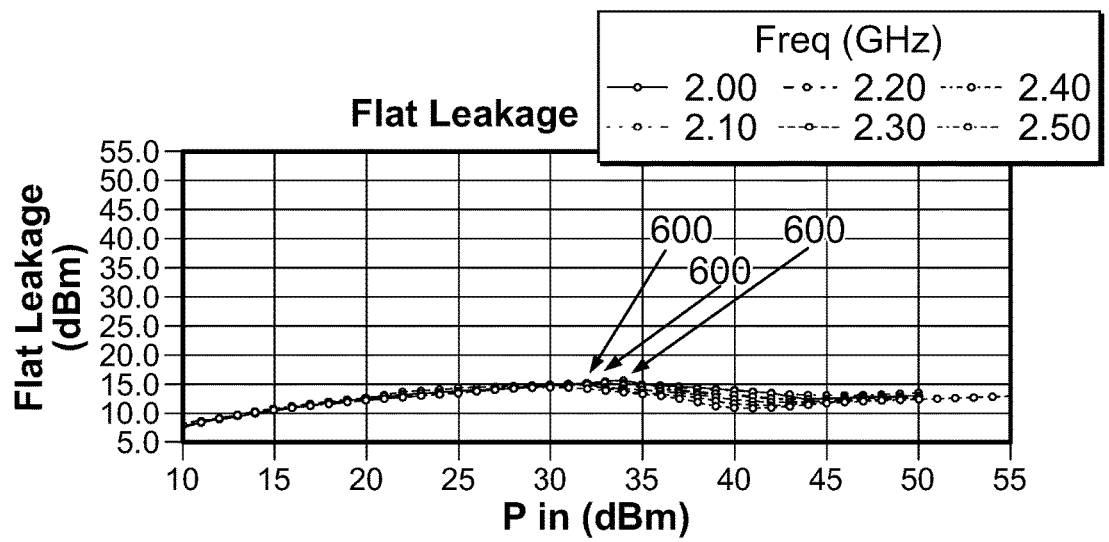
Figure 6D:
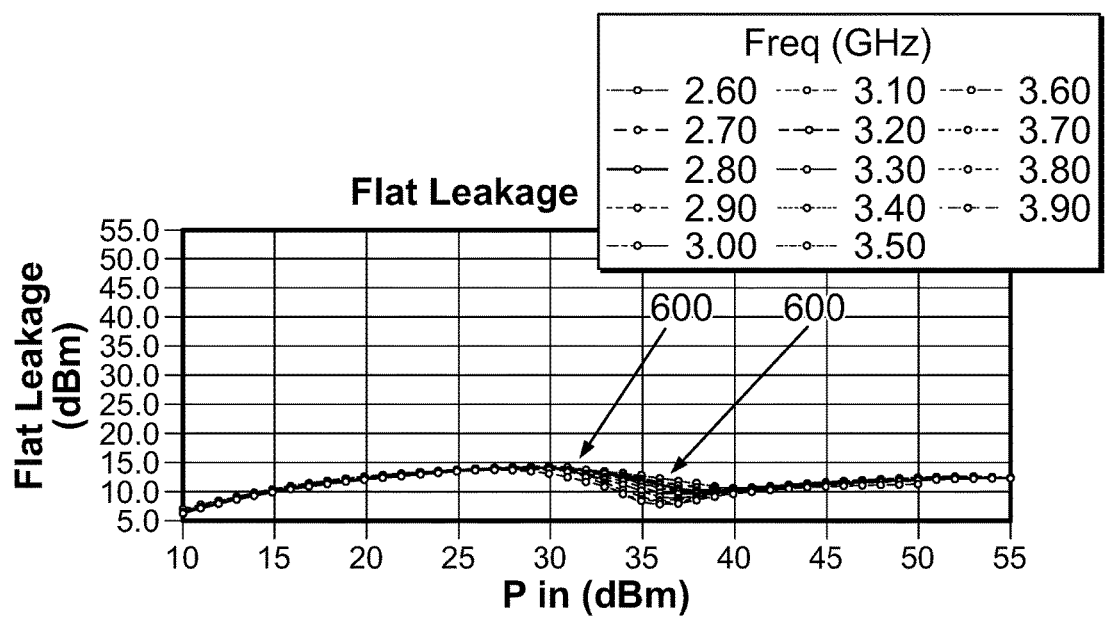
Figure 6E:
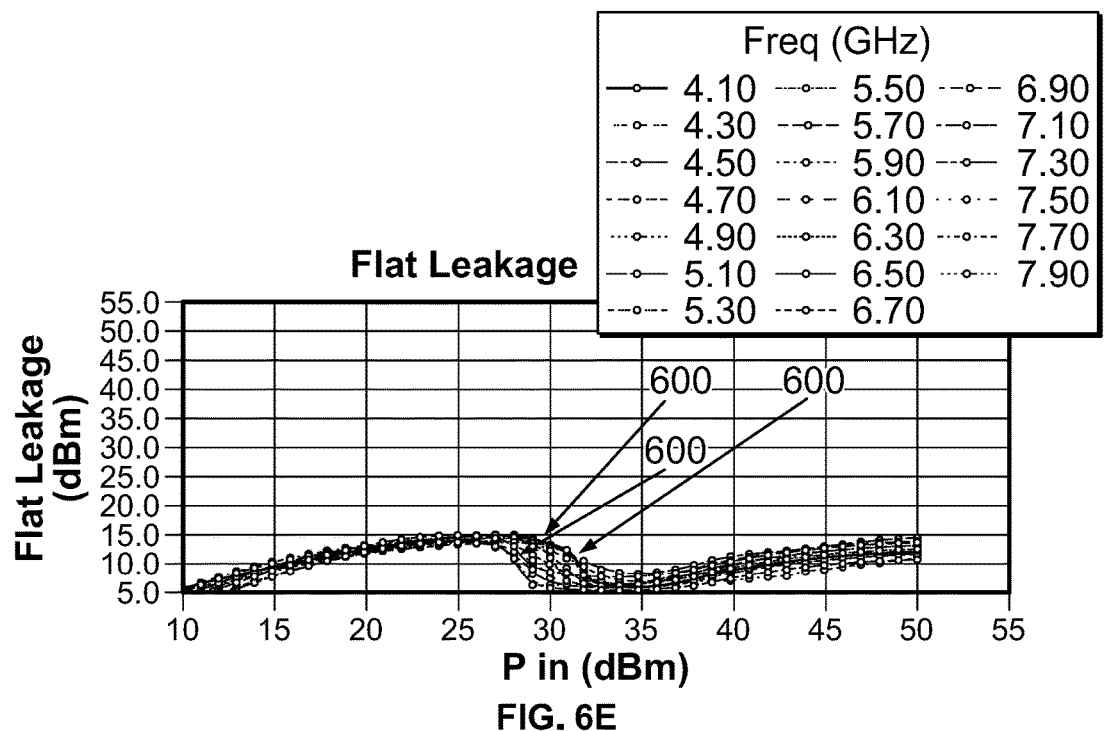
Figure 6F:
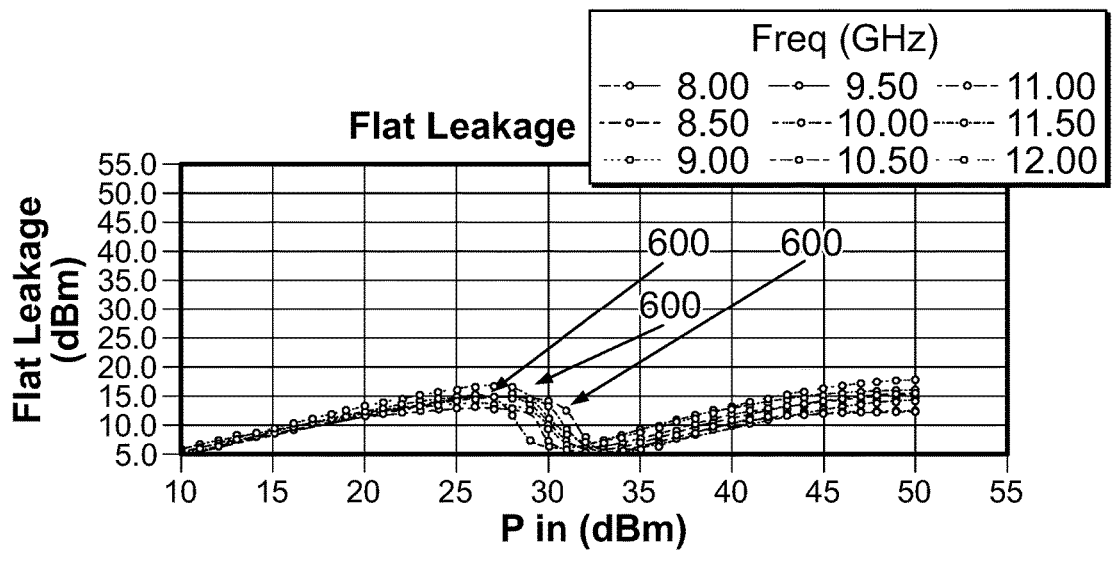
Figure 6G:
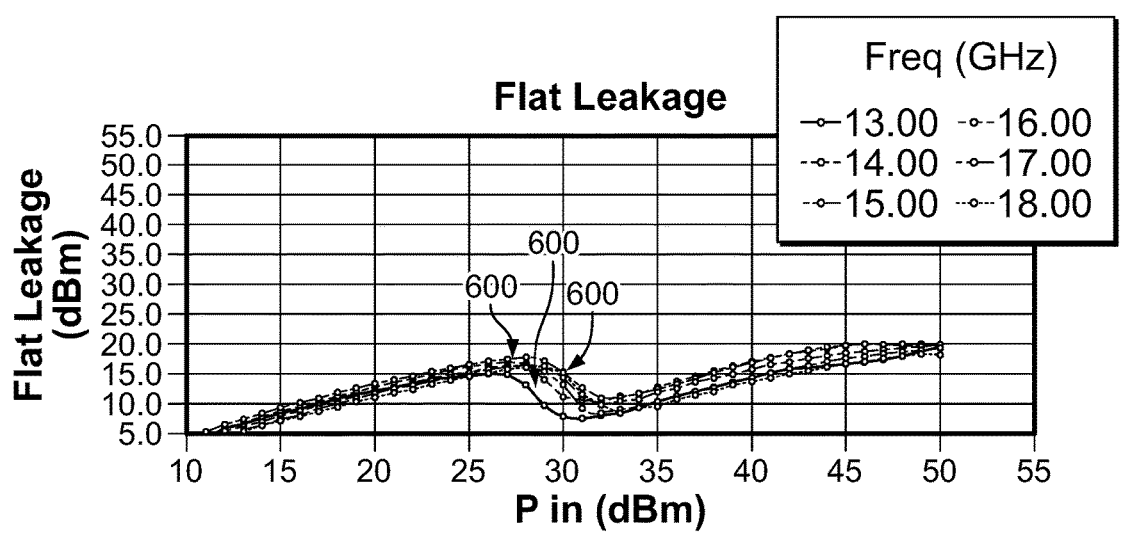

FIGS. 6A-6G show graphs of power in to a limiter (dBm) v. flat leakage out of limiter (dBm) for input RF frequencies from 0.10 GHz to 18 GHz for limiters according to one or more embodiments of the disclosed subject matter, such as limiter 210 of FIG. 4. Specifically, FIG. 6A shows input frequencies from 0.10 to 0.90 GHz, FIG. 6B shows input frequencies from 1.05 to 1.95 GHz, FIG. 6C shows input frequencies from 2.00 to 2.50 GHz, FIG. 6D shows input frequencies from 2.60 to 3.90 GHz, FIG. 6E shows input frequencies from 4.10 to 7.90 GHz, FIG. 6F shows input frequencies from 8.00 to 12.00 GHz, and FIG. 6G shows input frequencies from 13.00 to 18.00 GHz.

Generally, the graphs of FIGS. 6A-6G can be representative of limiting operations for limiter 210 without second Schottky diode 238. However, at least with respect frequencies up to approximately 2 GHz, largely corresponding to the graphs of FIGS. 6A and 6B, implementing second Schottky diode 238 can reduce the turn-on power further below +36 dBm for more margin.

Generally, FIGS. 6A-6G show that for the various frequencies the first PIN diodes 228 "turn on" when input power is less than or equal to +36 dBm, soon enough that flat leakage is less than or equal to 20 dBm, and such that spike leakage is less than or equal to 0.5 ergs. Notably, "knees" 600 indicate power levels for the various frequencies where the first PIN diodes 228 "turn on" to protect the second PIN diode 253.

Figure 7:
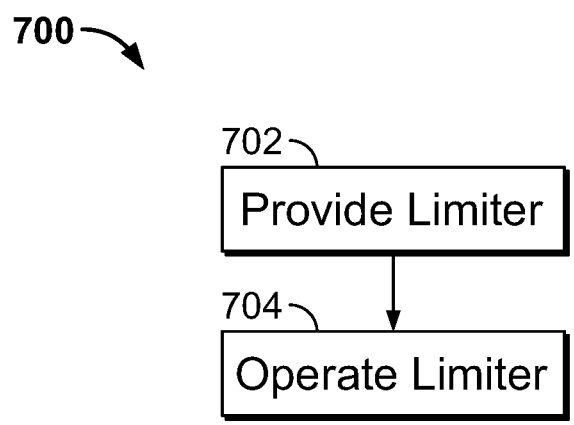
FIG. 7 is a flow chart of a method according to one or more embodiments of the disclosed subject matter.

FIG. 7 is a flow chart of a method 700 according to one or more embodiments of the disclosed subject matter.

At 702, the method 700 can provide a limiter system, limiter, or portion thereof, as described herein, such as limiter system 200, limiter 210, coarse section 220, or fine section 250.

At 704, the method 700 can operate the provided limiter system, limiter, or portion(s) thereof, as described herein, such as limiter system 200, limiter 210, coarse section 220, or fine section 250. Operation of the provided limiter system, limiter, or portion(s) thereof can be as described herein to produce desired results as described herein, such as shown in FIGS. 6A-6G.

Embodiments of the disclosed subject matter may also be as set forth according to the parentheticals in the following paragraphs.

(1) A single-channel, high-power, ultra-broadband radio frequency (RF) limiter system comprising: a coarse limiter section configured to receive a first RF signal having a first power value; and a fine limiter section coupled to an output of the coarse limiter section and configured to output a second RF signal having a second power value, the second power value being a limited power value less than the first power value, wherein the coarse limiter section includes: a first in-line capacitor at an input of the coarse limiter section configured to receive the first RF signal, a second in-line capacitor at the output of the coarse limiter section, a first conductive track having a first length and being coupled between the first in-line capacitor and the second in-line capacitor, a plurality of first PIN diodes each having a first I-region of a first thickness coupled between an output of the first conductive track and the second in-line capacitor, a rectifier coupled between the first in-line capacitor and an input of the first conductive track, a self-bias limiter coupled to the rectifier, and a coupled track configured to provide energy coupling between the first conductive track and the self-bias limiter, and wherein the fine limiter section includes: a third in-line capacitor configured to output the second RF signal having the second power value, a second conductive track having a second length and being coupled between the second in-line capacitor and the third in-line capacitor, and a second PIN diode having a second I-region of a second thickness coupled between the second conductive track and the third in-line capacitor, the first thickness of the first PIN diodes being greater than the second thickness of the second PIN diode, wherein the rectifier has: a first inductor having a first side coupled between the first in-line capacitor and the input of the first conductive track and a second side coupled to a first node, a second inductor having a first side coupled to the first node and a second side coupled to a second node, a capacitor coupled between the first node and ground, a resistor coupled between the second node and ground, and a first Schottky diode coupled between the second node and ground, and wherein the second node is coupled to the self-bias limiter.

(2) The limiter system according to (1), wherein the rectifier further has a second Schottky diode coupled between the first node and ground.

(3) The limiter system according to (1) or (2), wherein the coarse limiter section and the fine limiter section of the limiter system, together, have a bandwidth from 0.070 to 18.25 GHz.

(4) The limiter system according to any one of (1) to (3), wherein the self-bias limiter circuit is configured to protect the rectifier and has a pair of capacitors coupled to the second node of the rectifier and the coupled track, respectively, and a diode and an inductor coupled between the pair of capacitors and ground.

(5) The limiter system according to any one of (1) to (4), wherein the first power value is from 10 W to 1 kW.

(6) The limiter system according to any one of (1) to (5), wherein the coarse limiter section and the fine limiter section of the limiter system, together, have a bandwidth from 0.070 to 18.25 GHz.

(7) The limiter system according to any one of (1) to (6), wherein the coarse limiter section and the fine limiter section of the limiter system, together, are configured to provide a bandwidth from 0.070 to 18.25 GHz, a small signal insertion loss less than 3 dB, a VSWR of 2.0:1, a spike leakage of less than or equal to 0.5 ergs, a flat leakage of less than or equal to 20 dBm, and/or a recovery time of less than or equal to seven microseconds.

(8) The limiter system according to any one of (1) to (7), wherein the coarse limiter section is configured to turn on the plurality of first PIN diodes before the first power value of the first RF signal reaches 36 dBm.

(9) The limiter system according to any one of (1) to (8), wherein the coupled track is one of a common edge coupled microstrip, stripline, or wirebond coupler.

(10) The limiter system according to any one of (1) to (9), wherein the coarse limiter section and the fine limiter section are configured to operate without external power and switching control signals.

(11) The limiter system according to any one of (1) to (10), wherein the fine limiter section has only one second PIN diode having the second I-region of the second thickness.

(12) The limiter system according to any one of (1) to (11), wherein the first thickness of the first I-region of each of the plurality of first PIN diodes is 28 microns, and the second thickness of the second I-region of the second PIN diode is 2 microns.

(13) The limiter system according to any one of (1) to (12), wherein the fine limiter section further has an inductor coupled to the second conductive track and ground.

(14) A single-channel radio frequency (RF) limiter comprising: a first capacitor configured to receive a first RF signal; a rectifier coupled to an output of the first capacitor; a first conductive track having a first length and being coupled at a first end thereof to the output of the first capacitor and the rectifier; a second capacitor configured to output a second RF signal; a plurality of first PIN diodes each having a first I-region of a first thickness coupled between the second capacitor and a second end of the first conductive track; and a coupled track configured to provide energy coupling between the first conductive track and the rectifier, wherein the rectifier includes: a first inductor and a second inductor connected in series, a first side of the first inductor being coupled to the output of the first capacitor, a second side of the first inductor being coupled to a first side of the second inductor, and a first Schottky diode coupled to a second side of the second inductor and the coupled track.

(15) The limiter according to (14), wherein the rectifier further includes: a second Schottky diode and a capacitor coupled between the second end of the first inductor and the first end of the second inductor, and a resistor coupled to the second end of the second inductor and the first Schottky diode.

(16) The limiter according to (14) or (15), further comprising a self-bias limiter coupled between the rectifier and the coupled track and configured to protect the rectifier from reverse voltage breakdown.

(17) The limiter according to any one of (14) to (16), wherein the first RF signal has a power value from 10 W to 1 kW.

(18) The limiter according to any one of (14) to (17), wherein the limiter is configured to turn on the plurality of first PIN diodes before a power value of the first RF signal reaches 36 dBm.

(19) The limiter according to any one of (14) to (18), further comprising: a third capacitor configured to output a third RF signal; a second conductive track having a second length and being coupled between the second capacitor and the third capacitor; and a second PIN diode having a second I-region of a second thickness coupled between the second conductive track and the third capacitor, the first thickness of the first PIN diodes being greater than the second thickness of the second PIN diode.

(20) The limiter according to any one of (14) to (19), wherein the limiter is configured to provide a bandwidth from 0.070 to 18.25 GHz, a small signal insertion loss less than 3 dB, a VSWR of 2:1, a spike leakage of less than or equal to 0.5 ergs, a flat leakage of less than or equal to 20 dBm, and/or a recovery time of less than or equal to seven microseconds.

(21) A method comprising: providing a limiter according to any one of (1) to (20); and using the provided limiter.

(22) The method according to (21), wherein said using the provided limiter includes the limiter receiving a power signal and outputting a limited power signal.

Having now described embodiments of the disclosed subject matter, it should be apparent to those skilled in the art that the foregoing is merely illustrative and not limiting, having been presented by way of example only. Thus, although particular configurations have been discussed and illustrated herein, other configurations can be and are also employed. Further, numerous modifications and other embodiments (e.g., combinations, rearrangements, etc.) are enabled by the present disclosure and are contemplated as falling within the scope of the disclosed subject matter and any equivalents thereto. Features of the disclosed embodiments can be combined, rearranged, omitted, etc., within the scope of described subject matter to produce additional embodiments. Furthermore, certain features may sometimes be used to advantage without a corresponding use of other features. Accordingly, Applicant intends to embrace all such alternatives, modifications, equivalents, and variations that are within the spirit and scope of the present disclosure. Further, it is therefore to be understood that within the scope of the appended claims, the disclosure may be practiced otherwise than as specifically described herein.

What is claimed is:

1. A single-channel, high-power, ultra-broadband radio frequency (RF) limiter system comprising:
   a coarse limiter section configured to receive a first RF signal having a first power value; and
   a fine limiter section coupled to an output of the coarse limiter section and configured to output a second RF signal having a second power value, the second power value being a limited power value less than the first power value,
   wherein the coarse limiter section includes:
      a first in-line capacitor at an input of the coarse limiter section configured to receive the first RF signal,
      a second in-line capacitor at the output of the coarse limiter section,
      a first conductive track having a first length and being coupled between the first in-line capacitor and the second in-line capacitor,
      a plurality of first PIN diodes each having a first I-region of a first thickness coupled between an output of the first conductive track and the second in-line capacitor,
      a rectifier coupled between the first in-line capacitor and an input of the first conductive track,
      a self-bias limiter coupled to the rectifier, and
      a coupled track configured to provide energy coupling between the first conductive track and the self-bias limiter, and
   wherein the fine limiter section includes:
      a third in-line capacitor configured to output the second RF signal having the second power value,
      a second conductive track having a second length and being coupled between the second in-line capacitor and the third in-line capacitor, and
      a second PIN diode having a second I-region of a second thickness coupled between the second conductive track and the third in-line capacitor, the first thickness of the first PIN diodes being greater than the second thickness of the second PIN diode,
   wherein the rectifier has:
      a first inductor having a first side coupled between the first in-line capacitor and the input of the first conductive track and a second side coupled to a first node,
      a second inductor having a first side coupled to the first node and a second side coupled to a second node,
      a capacitor coupled between the first node and ground,
      a resistor coupled between the second node and ground, and
      a first Schottky diode coupled between the second node and ground, and
   wherein the second node is coupled to the self-bias limiter.

2. The limiter system according to claim 1, wherein the rectifier further has a second Schottky diode coupled between the first node and ground.

3. The limiter system according to claim 2, wherein the coarse limiter section and the fine limiter section of the limiter system, together, have a bandwidth from 0.070 to 18.25 GHz.

4. The limiter system according to claim 1, wherein the self-bias limiter circuit is configured to protect the rectifier and has a pair of capacitors coupled to the second node of the rectifier and the coupled track, respectively, and a diode and an inductor coupled between the pair of capacitors and ground.

5. The limiter system according to claim 1, wherein the first power value is from 10 W to 1 kW.

6. The limiter system according to claim 1, wherein the coarse limiter section and the fine limiter section of the limiter system, together, have a bandwidth from 0.070 to 18.25 GHz.

7. The limiter system according to claim 1, wherein the coarse limiter section and the fine limiter section of the limiter system, together, are configured to provide a bandwidth from 0.070 to 18.25 GHz, a small signal insertion loss less than 3 dB, a VSWR of 2:1, a spike leakage of less than or equal to 0.5 ergs, a flat leakage of less than or equal to 20 dBm, and/or a recovery time of less than or equal to seven microseconds.

8. The limiter system according to claim 1, wherein the coarse limiter section is configured to turn on the plurality of first PIN diodes before the first power value of the first RF signal reaches 36 dBm.

9. The limiter system according to claim 1, wherein the coupled track is one of a common edge coupled microstrip, stripline, or wirebond coupler.

10. The limiter system according to claim 1, wherein the coarse limiter section and the fine limiter section are configured to operate without external power and switching control signals.

11. The limiter system according to claim 1, wherein the fine limiter section has only one second PIN diode having the second I-region of the second thickness.

12. The limiter system according to claim 1, wherein the first thickness of the first I-region of each of the plurality of first PIN diodes is 28 microns, and the second thickness of the second I-region of the second PIN diode is 2 microns.

13. The limiter system according to claim 1, wherein the fine limiter section further has an inductor coupled to the second conductive track and ground.

14. A single-channel radio frequency (RF) limiter comprising:
a first capacitor configured to receive a first RF signal;
a rectifier coupled to an output of the first capacitor;
a first conductive track having a first length and being coupled at a first end thereof to the output of the first capacitor and the rectifier;
a second capacitor configured to output a second RF signal;
a plurality of first PIN diodes each having a first I-region of a first thickness coupled between the second capacitor and a second end of the first conductive track; and
a coupled track configured to provide energy coupling between the first conductive track and the rectifier,
wherein the rectifier includes:
a first inductor and a second inductor connected in series, a first side of the first inductor being coupled to the output of the first capacitor, a second side of the first inductor being coupled to a first side of the second inductor, and
a first Schottky diode coupled to a second side of the second inductor and the coupled track.

15. The limiter according to claim 14, wherein the rectifier further includes:
a second Schottky diode and a capacitor coupled between the second end of the first inductor and the first end of the second inductor, and
a resistor coupled to the second end of the second inductor and the first Schottky diode.

16. The limiter according to claim 14, further comprising a self-bias limiter coupled between the rectifier and the coupled track and configured to protect the rectifier from reverse voltage breakdown.

17. The limiter according to claim 14, wherein the first RF signal has a power value from 10 W to 1 kW.

18. The limiter according to claim 14, wherein the limiter is configured to turn on the plurality of first PIN diodes before a power value of the first RF signal reaches 36 dBm.

19. The limiter according to claim 14, further comprising:
a third capacitor configured to output a third RF signal;
a second conductive track having a second length and being coupled between the second capacitor and the third capacitor; and
a second PIN diode having a second I-region of a second thickness coupled between the second conductive track and the third capacitor, the first thickness of the first PIN diodes being greater than the second thickness of the second PIN diode.

20. The limiter according to claim 19, wherein the limiter is configured to provide a bandwidth from 0.070 to 18.25 GHz, a small signal insertion loss less than 3 dB, a VSWR of 2:1, a spike leakage of less than or equal to 0.5 ergs, a flat leakage of less than or equal to 20 dBm, and/or a recovery time of less than or equal to seven microseconds.

* * * * *